(12) United States Patent
Musa et al.

(10) Patent No.: US 10,547,021 B2
(45) Date of Patent: Jan. 28, 2020

(54) ORGANIC OPTOELECTRONIC COMPONENT AND METHOD FOR PRODUCING AN ORGANIC OPTOELECTRONIC COMPONENT

(71) Applicant: OSRAM OLED GmbH, Regensburg (DE)

(72) Inventors: Dieter Musa, Wenzenbach (DE); Simon Schicktanz, Regensburg (DE); Stefan Hartinger, Regensburg (DE); Tobias Pohl-Zander, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 98 days.

(21) Appl. No.: 15/538,692

(22) PCT Filed: Dec. 23, 2015

(86) PCT No.: PCT/EP2015/081160
§ 371 (c)(1),
(2) Date: Jun. 22, 2017

(87) PCT Pub. No.: WO2016/102667
PCT Pub. Date: Jun. 30, 2016

(65) Prior Publication Data
US 2018/0358574 A1    Dec. 13, 2018

(30) Foreign Application Priority Data

Dec. 23, 2014  (DE) .................. 10 2014 119 539

(51) Int. Cl.
*H01L 51/44* (2006.01)
*H01L 51/52* (2006.01)
*H01L 51/00* (2006.01)

(52) U.S. Cl.
CPC ...... *H01L 51/5203* (2013.01); *H01L 51/0031* (2013.01); *H01L 51/441* (2013.01); *H01L 2251/566* (2013.01)

(58) Field of Classification Search
CPC ...................................................... H01L 51/441
See application file for complete search history.

(56) References Cited

U.S. PATENT DOCUMENTS

| 4,952,031 A * | 8/1990 | Tsunoda | G02F 1/1354 345/11 |
| 9,583,740 B2 * | 2/2017 | Farrnbacher | H01L 24/72 |

(Continued)

FOREIGN PATENT DOCUMENTS

| CN | 1406041 A | 3/2003 |
| CN | 102971882 A | 3/2013 |

(Continued)

OTHER PUBLICATIONS

Farrnbacher, WO 2015/055760, published Apr. 23, 2015.*

(Continued)

*Primary Examiner* — Daniel Whalen
*Assistant Examiner* — Suberr L Chi
(74) *Attorney, Agent, or Firm* — Viering Jentschura & Partner MBB

(57) ABSTRACT

According to the present disclosure, an organic optoelectronic component provides with a first electrode, an organic functional layer structure above the first electrode, a second electrode above the organic functional layer structure, at least one contact section for electrically contacting the organic optoelectronic component, and an electrically conductive elastomer connector which is arranged above the contact section and is electrically connected to the contact section. The contact section is electrically connected to one of the electrodes.

16 Claims, 2 Drawing Sheets

(56) References Cited

U.S. PATENT DOCUMENTS

| | | | |
|---|---|---|---|
| 2002/0021084 A1 | 2/2002 | Yoneda | |
| 2003/0052598 A1 | 3/2003 | Yoneda et al. | |
| 2013/0087824 A1* | 4/2013 | Van Den Brand | H01L 51/448 257/99 |
| 2014/0193985 A1* | 7/2014 | Wang | H01R 43/007 439/66 |
| 2014/0300270 A1 | 10/2014 | Sakamoto | |
| 2015/0034931 A1 | 2/2015 | Matsuda | |
| 2015/0048352 A1 | 2/2015 | Ichiki | |
| 2015/0137710 A1 | 5/2015 | Miura | |

FOREIGN PATENT DOCUMENTS

| | | |
|---|---|---|
| CN | 104012173 A | 8/2014 |
| DE | 102012109138 A1 | 3/2014 |
| EP | 0915640 A1 | 5/1999 |
| EP | 1298962 A1 | 4/2003 |
| JP | 2001215894 A | 8/2001 |
| WO | 2013145694 A1 | 10/2013 |
| WO | 2013154047 A1 | 10/2013 |
| WO | 2014007322 A1 | 1/2014 |

OTHER PUBLICATIONS

First Search based on Chinese Application No. 2015800706559 (1 page) dated Mar. 26, 2018.
German Search Report based on application No. 10 2014 119 539.6 (10 pages) dated Dec. 11, 2015.
International Search Report based on application No. PCT/EP2015/081160 (7 pages) dated Mar. 14, 2016.

* cited by examiner

ORGANIC OPTOELECTRONIC COMPONENT AND METHOD FOR PRODUCING AN ORGANIC OPTOELECTRONIC COMPONENT

RELATED APPLICATIONS

The present application is a national stage entry according to 35 U.S.C. § 371 of PCT application No. PCT/EP2015/081160 filed on Dec. 23, 2015, which claims priority from German application No. 10 2014 119 539.6 filed on Dec. 23, 2014, and is incorporated herein by reference in its entirety.

TECHNICAL FIELD

The present disclosure relates to an organic optoelectronic component having an organic functional layer structure, and a method for producing such an organic optoelectronic component.

BACKGROUND

Optoelectronic components which emit light may, for example, be light-emitting diodes (LEDs) or organic light-emitting diodes (OLEDs). An OLED may include an anode and a cathode with an organic functional layer system therebetween. The organic functional layer system may include one or a plurality of emitter layers in which electromagnetic radiation is generated, a charge carrier pair generation layer structure made up of two or more charge carrier pair-generation layers (charge generating layers, CGLs) for charge carrier pair generation, and one or a plurality of electron blocking layers, also referred to as hole transport layer(s) (HTL), and one or a plurality of hole blocking layers, also referred to as electron transport layer(s) (ETL), in order to direct the current flow.

Such organic optoelectronic components are generally produced and fabricated in the wafer assembly. After applying the individual layers of the organic optoelectronic components to a wafer substrate, the organic optoelectronic components are singulated. For external contacting, their contact sections are upgraded using flex-on-glass techniques such as ACF bonding. Alternatively, ultrasonically bonded or thermally/pressure-enhanced external contacts are provided at the component level using a conductive adhesive. A customer can solder a singulated organic optoelectronic component to, for example, a printed circuit board. Alternatively, electrical plugs which are suitable for the organic optoelectronic component are provided to the customer, via which the customer can electrically connect the organic optoelectronic component externally.

Such external electrical connection techniques require organic optoelectronic components which are singulated from the wafer assembly. In particular, a contact section of the organic optoelectronic component produced in the wafer assembly is not usable in the wafer assembly; therefore, for example, a test for functionality of the individual organic optoelectronic components at the wafer level, i.e., in the wafer assembly, is often not possible.

In addition, the external electrical connection produced in a conventional manner generally cannot be disconnected without limiting or even destroying components and/or functions of the organic optoelectronic component.

SUMMARY

The object of the present disclosure is to provide an organic optoelectronic component which enables an external electrical connection in a simple manner, in particular without being singulated from a wafer assembly for this purpose, and/or which enables a disconnectable external electrical connection, in particular without negatively affecting functions of the organic optoelectronic component, and/or which enables a robust external electrical connection.

A further object of the present disclosure is to provide a method for producing an organic optoelectronic component which can be carried out in a simple and/or economical manner, and which in particular enables external electrical contacting in the wafer assembly, and/or enables disconnectable and/or robust external electrical contacting.

According to one aspect of the present disclosure, the object is achieved via an organic optoelectronic component including a first electrode, an organic functional layer structure above the first electrode, a second electrode above the organic functional layer structure, and at least one contact section for electrically contacting the organic optoelectronic component. The contact section is electrically connected to one of the electrodes. In addition, the organic optoelectronic component includes an electrically conductive elastomer connector which is arranged above the contact section and is electrically connected to the contact section.

The elastomer connector is arranged for electrically contacting the electrode which is electrically connected to the contact section. The elastomer connector enables testing and/or measuring the organic optoelectronic components even in the wafer assembly. Thus, singulation of the organic optoelectronic component from the wafer assembly is no longer mandatory for testing or measuring. In addition, a robust structure of the organic optoelectronic component having defined contact regions is obtained with the aid of the elastomer connector. Furthermore, in the application area of the organic optoelectronic component, it is possible with the aid of the elastomer connector to provide a connection which can be disconnected again. The connection via the elastomer connector also enables withstanding aggressive media such as corrosive gases, withstands temperature or humidity effects in the user area, and/or is characterized by its robust properties.

The first electrode and the second electrode are arranged for electrically contacting the organic functional layer structure. For example, the first electrode and the second electrode are each configured as an electrically conductive electrode layer or as part of an electrically conductive electrode layer.

The organic functional layer structure is configured to convert electrical energy into light, or to convert light into electrical energy. For example, the organic optoelectronic component is an OLED, and the organic functional layer structure is an optically active region of the OLED.

The contact section is configured for electrically contacting the organic optoelectronic component. For example, the contact section is an open region of one of the electrodes, at which an external connection can be applied. In particular, the contact section is electrically connected to the first electrode or the second electrode. For example, the contact section is an electrically conductive partial layer, for example, a metal layer arranged in regions, which is arranged on or under the one electrode and is directly connected electrically and/or physically to said electrode.

The elastomer connector is a connecting element which is rigid but is elastically deformable. For example, the elastomer connector contains at least one plastic, the glass transition point of which is below the operating temperature. The plastic can deform elastically under tensile stress and compressive stress, and returns to its original, undeformed shape after the tensile stress or compressive stress is removed. For example, the plastic of the elastomer connector includes natural rubber or silicone rubber, or is formed from it.

The elastomer connector is electrically conductive. For this purpose, the material of the elastomer connector is configured overall to be electrically conductive, or the elastomer connector includes at least one material, for example, a layer and/or components, which has electrically conductive properties. Since the material is electrically conductive or has electrically conductive properties, this means that the material is not an insulator.

According to one refinement, the elastomer connector is elastic and has a modulus of elasticity from 1 N/mm$^2$ to 10 N/mm$^2$, in particular from 2.5 N/mm$^2$ to 7.5 N/mm$^2$.

Due to the elastic properties and a modulus of elasticity in the aforementioned range, it is in particular possible to arrange a robust and/or disconnectable, externally conductive connection at the elastomer connector, without damaging, let alone destroying, electrically conductive components.

"Elastic" is in particular to be understood to mean that the elastomer connector can respond to an applied force in a reversible manner. The modulus of elasticity in the aforementioned range enables a desirable and/or reversible deformation of the elastomer connector.

According to one refinement, the elastomer connector includes electrically conductive material and electrically insulating material. The electrically conductive material is configured in such a way and distributed in the elastomer connector in such a way that electrical conductivity is provided for external electrical contacting via the elastomer connector.

Due to the combination of electrically conductive material and electrically insulating material, in particular advantageous and desirable properties of different materials may be provided and combined. For example, the electrical conductivity and the elastic properties of the elastomer connector may thus be generated simultaneously.

For example, the elastomer connector includes carbon, a polymer, a metal, rubber, and/or silicone as a material.

According to one refinement, the elastomer connector includes alternating electrically conductive and electrically insulating layers which extend perpendicularly to a lateral extension of the organically functional layer structure, wherein the electrically conductive layers are electrically connected to the contact section.

By means of the perpendicularly arranged, electrically conductive layers, electrical conductivity of the elastomer connector may be achieved in a direction which is perpendicular to the organic functional layer structure. Simultaneously, by means of the perpendicularly arranged, electrically insulating layers, an elastic deformation may be made possible, for example, also in a direction perpendicular to the organic functional layer structure.

The perpendicular direction relates in particular to a lateral extension of the individual layers of the organic optoelectronic component, and/or to a lateral extension of the organic optoelectronic component overall.

According to one refinement, the elastomer connector includes an electrically insulating carrier material in which electrically conductive structures are embedded.

For example, the electrically insulating carrier material is a carbon matrix, a silicone, a polymer, and/or a rubber. The embedded, electrically conductive structures are, for example, electrically conductive threads; electrically conductive particles, for example, silver particles; electrically conductive nanothreads, for example, Ag nanothreads; or carbon nanotubes. In this case, in particular the percolation threshold, i.e., the formation of connected regions of the electrically conductive structures in the electrically insulating carrier material, is exceeded, so that sufficient electrical conductivity of the elastomer connector is provided overall.

According to one refinement, the elastomer connector includes an electrically insulating elastic base body which is wrapped with an electrically conductive thread, wherein an axis of the base body about which the thread is wrapped extends in a lateral direction.

For example, the base body is a silicone body which is wrapped with the thread. By means of the wrapping, in particular electrical conductivity may be generated from the contact section to an opposite side of the elastomer connector.

According to one refinement, for electrically contacting the organic optoelectronic component, a contact pin is arranged in the elastomer connector and is connected to the elastomer connector in a force-locking manner. The contact pin may be arranged in the elastomer connector in a direction perpendicular to the lateral extension of the organic functional layer structure. The contact pin may be configured to be pointed and/or needle-shaped, so that it can easily be inserted into the material of the elastomer connector.

By means of the contact pin, simple, robust, and/or disconnectable external electrically conductive contacting may be achieved. For external contacting, only the contact pin must be inserted into the elastomer connector. Due to the elastic properties of the connector, a force-locking connection between the contact pin and the elastomer connector is thus possible. The force-locking connection is created in that, when the contact pin is inserted, the material of the elastomer connector is displaced by the contact pin, and the material exerts a counterpressure on the contact pin due to its elastic properties. Thus, a reliable and robust connection is created which, for example, also withstands possible vibration at and around the organic optoelectronic component. In addition, advantageous and desirable requirements become possible with respect to the entry of aggressive media and moisture, and with respect to withstanding undesirable temperatures.

According to one refinement, the contact pin includes a barb which is arranged in the elastomer connector, wherein the contact pin including the barb is connected to the elastomer connector in a positively locking manner.

By means of the barb of the contact pin which is introduced into the elastomer connector and is connected to it in a positively locking manner, a particularly robust and/or permanent connection becomes possible for external electrical contacting. The positively locking connection is created in that, when the contact pin is inserted, the material of the elastomer connector is displaced by the contact pin and the barb, and the material at least partially closes again due to its elastic properties, so that the barb is hooked therein. Easy and possibly unintentional removal of the contact pin from the elastomer connector is made more difficult due to the barb. The barb may, for example, be formed on the end of the contact pin and/or may include a point which points against the direction of a point of the contact pin.

According to one refinement, a metal layer is configured above the second electrode and includes at least one recess for passing the contact pin into the elastomer connector.

In this case, the metal layer is used as a final layer of the organic optoelectronic component, in particular as a lid, for example, as a foil lid. The metal layer may also be provided to attach, to mount, and/or to clamp the elastomer connector on the contact section. The metal layer advantageously extends over the entire lateral extension of the organic optoelectronic component, except for necessary, configured spacings and/or gaps with respect to the electric insulation between individual partial regions of the organic optoelectronic component, and except for the recess for passing the contact pin.

According to one refinement, for test operation in the wafer assembly, a first recess is configured in the metal layer for electrically contacting the organic optoelectronic component, and for application operation in the singulated state of the organic optoelectronic component, a second recess is configured for electrically contacting the organic optoelectronic component.

By means of the arrangement of two recesses, in particular configured for test operation and application operation, an intact interface of the organic optoelectronic component may be provided to the customer or the user, despite the test operation carried out in the wafer assembly.

The contact pin, which is inserted into the first recess during test operation, may remain in the first recess and in the elastomer connector after the test operation. Alternatively, after the test operation, it is possible to remove the contact pin required for this purpose. In both cases, the second recess remains untouched and undamaged, so that an intact region of the elastomer connector is provided for application operation.

Alternatively to two recesses, it is possible to implement a test contact over a large area on the metal layer via a conductive coupling of the elastomer connector to the metal layer. Test operation which is easy to carry out thereby becomes possible. Furthermore, during test operation, it is possible to use a flattened and/or wide contact pin without a point for contacting the elastomer connector, wherein the corresponding contact pin is only brought into physical contact with the elastomer connector, and is not inserted into it.

The object is furthermore achieved via a method for producing an organic optoelectronic component, for example, the organic optoelectronic component described above. Under the method, the first electrode is configured, the organic functional layer structure is configured above the first electrode, the second electrode is configured above the organic functional layer structure, and at least the one contact section for electrically contacting the organic optoelectronic component is configured, wherein the contact section is electrically connected to the corresponding electrodes. Furthermore, the electrically conductive elastomer connector is arranged above the contact section and is electrically connected to the contact section.

The production method is characterized by a conventional, known production of the layer structure of the organic optoelectronic component, including a possibly required exposure of the contact region. Subsequently, as a modification to the conventional production method, the elastomer connector is applied to the contact section, for example, by means of a conductive adhesive.

The method is characterized in particular by its simple and economical implementation, and by its possible external contacting in the wafer assembly, and/or by its established, disconnectable external electrical contacting.

Alternative embodiments and/or advantages relating to the elastomer connector, the organic functional layer structure, the organic optoelectronic component, and/or components thereof, are already carried out above in the application in connection with the respective product, and of course correspondingly find use in the production method without again being explicitly specified here.

According to one refinement, the metal layer is configured above the elastomer connector, wherein at least the one recess is configured in the metal layer for the external electrical contacting of the corresponding contact section.

The elastomer connector may be applied to the contact section is a self-adhesive manner, for example, by means of conductive adhesive. Alternatively, the elastomer connector may be clamped below the metal layer. In this case, the metal layer is thus used as a lid, for example, as a foil lid, and seals off the organic optoelectronic component from its surroundings.

According to one refinement, for electrically contacting the organic optoelectronic component, at least the one contact pin is guided through the recess and inserted into the elastomer connector. In this case, the contact pin is used for external electrical contacting. Thus, the contact pin is configured to be electrically conductive and is electrically conductively connected to the elastomer connector.

By means of the contact pin, simple, yet robust, and in particular disconnectable, contacting is made possible. Rapid contacting of the organic optoelectronic component thus becomes possible.

According to one refinement, the organic optoelectronic component is produced in the wafer assembly, wherein the organic optoelectronic component is tested in the wafer assembly before singulation of the corresponding optoelectronic components from the wafer assembly.

For testing, a contact pin is inserted into elastomer connector and is electrically conductively connected to it, during test operation in the wafer assembly. Following the test operation, this contact pin may remain in the elastomer connector, or alternatively, it may be removed without substantial damage to the elastomer connector, due to the disconnectable connection between the contact pin and the elastomer connector.

According to one refinement, after the test, the organic optoelectronic component is singulated from the wafer assembly, and is in particular prepared for application operation. During application operation, simple external electrical contacting may be achieved via the contact pin.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

Figure 1:
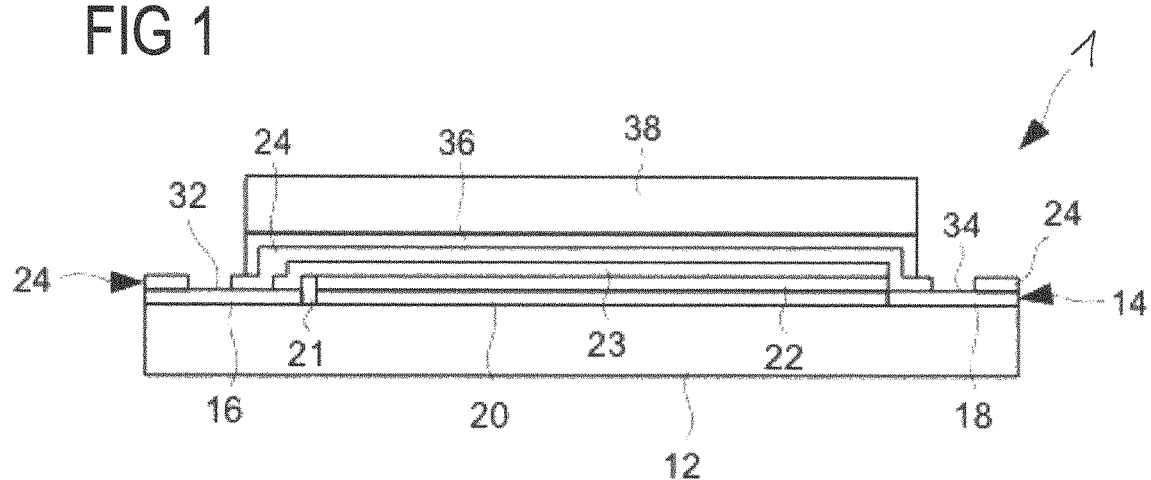
FIG. 1 shows a lateral cross-sectional view of a conventional organic optoelectronic component.

In the following detailed description, reference will be made to the appended drawings, which form part of this description and in which specific embodiments in which the present disclosure may be carried out are shown for illustration. In this respect, directional terminology, for example, "above," "below," "in front," "behind," "front," "rear," etc., is used with reference to the orientation of the described figure(s). Since components of embodiments may be positioned in a number of different orientations, the directional terminology is used for illustration and is in no way restrictive. It is to be understood that other embodiments may be used, and structural or logical changes may be carried out, without departing from the scope of protection of the present disclosure. It is to be understood that the features of the various embodiments described herein may be combined with one another, unless otherwise specified. The following detailed description is therefore not to be understood in the restricted sense, and the scope of protection of the present disclosure is defined by the appended claims.

Within the scope of this description, the terms "connected," "linked," and "coupled" are used for describing both a direct and an indirect connection, a direct or indirect link, and direct or indirect coupling. In the figures, identical or similar elements are provided with identical reference numerals, insofar as this is expedient.

An organic optoelectronic component may be an organic component emitting electromagnetic radiation or an organic component absorbing electromagnetic radiation. An organic component absorbing electromagnetic radiation may, for example, be an organic solar cell or an organic photocell. In various embodiments, an organic component emitting electromagnetic radiation may be configured as an organic diode emitting electromagnetic radiation (organic light-emitting diode, OLED), or as an organic transistor emitting electromagnetic radiation. The radiation may, for example, be light in the visible range, UV light, and/or infrared light. In various embodiments, the organic light-emitting component may be part of an integrated circuit. Furthermore, a plurality of organic light-emitting components may be provided, for example, accommodated in a shared housing.

FIG. 1 shows a conventional organic optoelectronic component 1. The organic optoelectronic component 1 includes a carrier 12. The carrier 12 may be configured to be translucent or transparent. The carrier 12 acts as a carrier element for electronic elements or layers, for example, light-emitting elements. The carrier 12 may, for example, include plastic, metal, glass, quartz, and/or a semiconductor material, or may be formed from them. Furthermore, the carrier 12 may include a plastic foil or a laminate including one or a plurality of plastic foils, or may be formed from them. The carrier 12 may be configured to be mechanically rigid or mechanically flexible.

An optoelectronic layer structure is configured on the carrier 12. The optoelectronic layer structure includes a first electrode layer 14 which includes a first contact section 16, a second contact section 18, and a first electrode 20. The carrier 12 including the first electrode layer 14 may also be referred to as a substrate. A first barrier layer, which is not depicted, for example, a first barrier thin-film layer, may be configured between the carrier 12 and the first electrode layer 14.

The first electrode 20 is electrically insulated from the first contact section 16 by means of an electrical insulation barrier 21. The second contact section 18 is electrically coupled to the first electrode 20 of the optoelectronic layer structure. The first electrode 20 may be configured as an anode or as a cathode. The first electrode 20 may be configured to be translucent or transparent. The first electrode 20 includes an electrically conductive material, for example, metal and/or a transparent conductive oxide (TCO), or a layer stack having multiple layers which include metals or TCOs. The first electrode 20 may, for example, include a layer stack made of a combination of a layer of a metal on a layer of a TCO, or vice-versa. One example is a silver layer which is applied to an indium tin oxide (ITO) layer (Ag on ITO), or multiple ITO-Ag-ITO layers. Alternatively or in addition to the aforementioned materials, the first electrode 20 may include networks made up of metallic nanothreads and nanoparticles, for example, made of Ag; networks made up of carbon nanotubes, graphene particles, and graphene layers; and/or networks made up of semiconductor nanothreads.

An optically functional layer structure, for example, an organic functional layer structure 22, of the optoelectronic layer structure is configured above the first electrode 20. The organic functional layer structure 22 may, for example, include one, two, or more partial layers. For example, the organic functional layer structure 22 may include a hole injection layer, a hole transport layer, an emitter layer, an electron transport layer, and/or an electron injection layer. The hole injection layer is used for reducing the band gap between the first electrode and the hole transport layer. The hole conductivity of the hole transport layer is greater than the electron conductivity. The hole transport layer is used for transporting the holes. The electron conductivity of the electron transport layer is greater than the hole conductivity. The electron transport layer is used for transporting the holes. The electron injection layer is used for reducing the band gap between the second electrode and the electron transport layer. Furthermore, the organic functional layer structure 22 may include one, two, or more functional layer structure units, each including the aforementioned partial layers and/or additional intermediate layers.

A second electrode 23 of the optoelectronic layer structure is configured above the organic functional layer structure 22 and is electrically coupled to the first contact section 16. The second electrode 23 may be configured according to one of the embodiments of the first electrode 20, wherein the first electrode 20 and the second electrode 23 may be configured identically or differently. The first electrode 20 is used, for example, as an anode or cathode of the optoelectronic layer structure. Corresponding to the first electrode, the second electrode 23 is used as a cathode or anode of the optoelectronic layer structure.

The optoelectronic layer structure is an electrically and/or optically active region. The active region is, for example, the region of the optoelectronic component in which electric current flows for operating the optoelectronic component and/or in which electromagnetic radiation is generated or absorbed. A Getter structure (not depicted) may be arranged on or above the active region. The Getter layer may be configured to be translucent, transparent, or opaque. The Getter layer may include a material or may be formed from it, said material absorbing and binding substances which are harmful to the active region.

An encapsulation layer 24 of the optoelectronic layer structure, which encapsulates the optoelectronic layer structure, is configured above the second electrode 23 and partially above the first contact section 16 and partially above the second contact section 18. The encapsulation layer 24 may be configured as a second barrier layer, for example, as a second barrier thin-film layer. The encapsulation layer 24 may be referred to as a thin-film encapsulation. The encapsulation layer 24 forms a barrier against chemical impurities or atmospheric substances, in particular against water (moisture) and oxygen. The encapsulation layer 24 may be configured as a single layer, a layer stack, or a layer structure. The encapsulation layer 24 may include, or be formed from aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly (p-phenylene terephthalamide), nylon 66, and mixtures and alloys of the same. The first barrier layer may optionally be configured on the carrier 12, corresponding to an embodiment of the encapsulation layer 24.

In the encapsulation layer 24, a first recess of the encapsulation layer 24 is configured above the first contact section 16, and a second recess of the encapsulation layer 24 is configured above the second contact section 18. A first contact region 32 is exposed in the first recess of the encapsulation layer 24, and a second contact region 34 is exposed in the second recess of the encapsulation layer 24. The first contact region 32 is used for electrically contacting the first contact section 16, and the second contact region 34 is used for electrically contacting the second contact section 18.

An adhesive layer 36 is configured above the encapsulation layer 24. The adhesive layer 36 includes, for example, an adhesive, for example, a glue, for example, a laminating glue, a resist, and/or a resin. The adhesive layer 36 may, for example, include particles which scatter electromagnetic radiation, for example, light-scattering particles.

A covering body 38 is configured above the adhesive layer 36. The adhesive layer 36 is used for attaching the covering body 38 to the encapsulation layer 24. The covering body 38 includes, for example, plastic, glass, and/or metal. For example, the covering body 38 may be formed essentially from glass and may include a thin layer, for example, a metal foil, and/or a graphite layer, for example, a graphite laminate, on the glass body. The covering body 38 is used for protecting the conventional optoelectronic component 1, for example, from the effects of external mechanical forces. Furthermore, the covering body 38 may be used for distributing and/or dissipating heat which is generated in the conventional optoelectronic component 1. For example, the glass of the covering body 38 may be used as a protection from external effects, and the metal layer of the covering body 38 may be used for distributing and/or dissipating the heat generated during the operation of the conventional optoelectronic component 1.

Figure 2A:
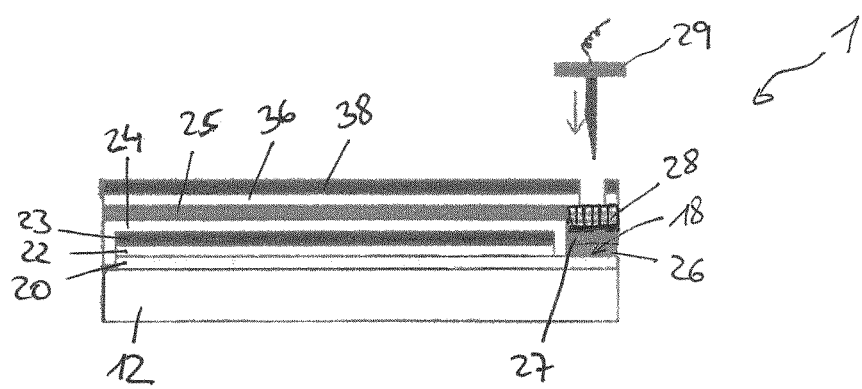
FIG. 2A shows a lateral cross-sectional view of an embodiment of an organic optoelectronic component.

FIG. 2A shows an embodiment of an organic optoelectronic component 1 which, for example, may largely correspond to the organic optoelectronic component 1 depicted in FIG. 1. The organic optoelectronic component 1 includes the carrier 12, which in particular is configured as a glass substrate; the first electrode 20 above the carrier 12, which in particular is a TCO layer and in particular acts as an anode; the organic functional layer structure 22 on the first electrode 20; the second electrode 23 on the organic functional layer structure 22, which in particular acts as a cathode; an encapsulation layer 24, which is in particular a TFE layer, on the second electrode 23; a cladding layer 25 on the encapsulation layer 24; the adhesive layer 36 on the cladding layer 25; and the covering body 38. The cladding layer 25 is a glue which may also be referred to as a coating. The cladding layer 25 is used as an additional diffusion layer and as a protective layer for the encapsulation layer.

The carrier 12 is used as a carrier element for the additional layers arranged on it.

The organic functional layer structure 22 may include one, two, or more partial layers. For example, the organic functional layer structure 22 may include the hole injection layer, the hole transport layer, the emitter layer, the electron transport layer, and/or the electron injection layer. The hole injection layer is used for reducing the band gap between the first electrode and the hole transport layer. The hole conductivity of the hole transport layer is greater than the electron conductivity. The hole transport layer is used for transporting the holes. The electron conductivity of the electron transport layer is greater than the hole conductivity. The electron transport layer is used for transporting the holes. The electron injection layer is used for reducing the band gap between the second electrode and the electron transport layer. Furthermore, the organic functional layer structure 22 may include one, two, or more functional layer structure units, each including the aforementioned partial layers and/or additional intermediate layers.

The encapsulation layer 24 may be configured as a barrier layer, for example, as a barrier thin-film layer. The encapsulation layer 24 may be referred to as a thin-film encapsulation. The encapsulation layer 24 forms a barrier against chemical impurities or atmospheric substances, in particular against water (moisture) and oxygen. The encapsulation layer 24 may be configured as a single layer, a layer stack, or a layer structure. The encapsulation layer 24 may include, or may be formed, from aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly (p-phenylene terephthalamide), nylon 66, and mixtures and alloys of the same, or tetrafluoroethylene (TFE).

The adhesive layer 36 includes, for example, an adhesive, for example, a glue, for example, a laminating glue and/or PSA (pressure-sensitive adhesive), a resist, and/or a resin. The adhesive layer 36 may, for example, include particles which scatter electromagnetic radiation, for example, light-scattering particles. The adhesive layer 36 is used for attaching the covering body 38 to the encapsulation layer 24. The covering body 38 is used for protecting the organic optoelectronic component 1, for example, from the effects of external mechanical forces. Furthermore, the covering body 38 may be used for distributing and/or dissipating heat which is generated in the organic optoelectronic component 1. The covering body 38 may in particular include or be a metal layer or a metal foil.

The first electrode 20 includes the contact section 18, which is configured for the external electrical contacting of the organic optoelectronic component 1. For this purpose, the contact section 18 is electrically conductively connected to the first electrode 20. In particular, the contact section 18 is a partial region of the first electrode layer 14, and the first electrode 20 is an adjacent partial region of the first electrode layer 14. The layers following the first electrode 20 are recessed in the region of the contact section 18, so that the external electrical contacting is possible.

A metal contact 26, for example, a layer sequence made up of a chrome layer, an aluminum layer, and an additional chrome layer, is arranged on the contact section 18. A conductive adhesive 27, for example, made of nickel and/or silver, is applied on this metal contact 26. An elastomer connector 28, which includes at least one exposed partial region for external electrical contacting, is arranged on the conductive adhesive.

The elastomer connector has elastic, shape-retaining, and electrically conductive properties, so that electrically contacting the first electrode 20 is possible by means of the elastomer connector 28, the conductive adhesive 27, and the metal contact 26. For example, the elastomer connector has a modulus of elasticity from 1 N/mm² to 10 N/mm², in particular from 2.5 N/mm² to 7.5 N/mm². In particular, the elastomer connector includes electrically conductive and electrically non-conductive layers which are arranged in an alternating manner and which are made of silicone rubber, said layers extending in a vertical direction with respect to the lateral extension of the organic functional layer structure 22.

An electrically conductive contact pin 29, for example, a contact pin, is introduced, inserted, and/or pushed into the elastomer connector 28 for external electrical contacting, as schematically depicted in FIG. 2A. The contact pin 29 includes a base plate and a pin which projects from it. The pin is advantageously configured to be needle-shaped and/or pointed. The contact pin 29 is subsequently introduced, inserted, or pushed into the elastomer connector 28 and is encompassed by it. The contact pin 29 displaces the material of the elastomer connector 28 and forms a hole in the elastomer connector 28. Due to its elastic properties, the material of the elastomer connector 28 exerts a counterforce on the contact pin 29, whereby a force-locking connection is created between the contact pin 29 and the elastomer connector 28. Contacting via the elastomer connector 28 and the contact pin 29 enables a robust external connection which can be disconnected again, and which in particular allows an external connection of the organic optoelectronic component 1 in the wafer assembly. This is discussed in greater detail in connection with FIG. 2B.

In order to be able to introduce the contact pin 29 into the elastomer connector 28, the covering body 38 and the adhesive layer 36 each include a recess in the relevant region. For example, the covering body 38 which is configured as a metal layer includes pre-cut holes or holes introduced subsequently, for example, by means of a laser.

In the contacted state, the base plate of the contact pin 29 may be arranged above the recess of the covering body 38. This means that the lateral extension of the base plate of the contact pin 29 is larger than the lateral extension of the recess of the covering body 38.

Alternatively to the elastomer connector 28 discussed above, the connector may be configured as an elastic body, for example, a silicone body, including a wrapped thread, wherein axes of the body and/or of the windings are oriented in a lateral direction. Alternatively, the elastomer connector 29 may include a carbon matrix with embedded metal threads, and may be formed from it.

As another alternative, the elastomer connector may not be attached to the metal contact 26 via the conductive adhesive 27, but rather may be clamped below the covering body 38, in particular the metal layer. In this case, the conductive adhesive 27 is optional.

Figure 2B:
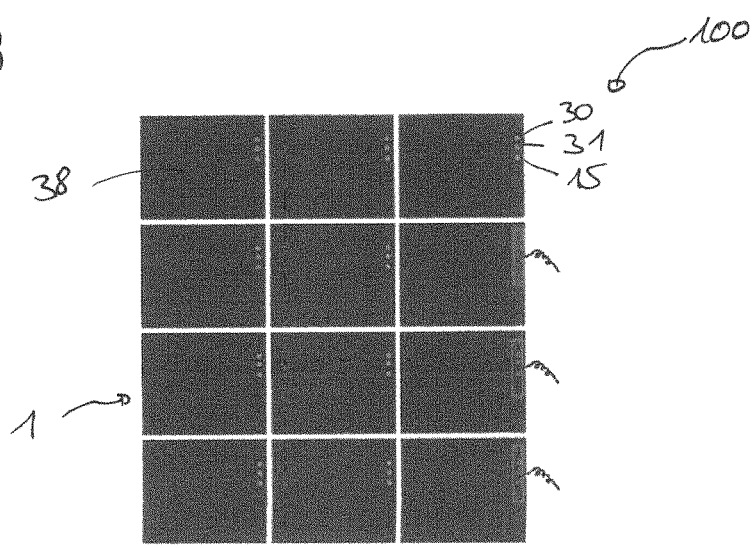
FIG. 2B shows a top view onto the embodiment of the organic optoelectronic component of FIG. 2A in the wafer assembly.

FIG. 2B shows the embodiment of the organic optoelectronic component 1 of FIG. 2A in the wafer assembly 100, in particular with a view onto the organic optoelectronic component 1. The organic optoelectronic component 1 is thus also arranged in the assembly with a plurality of identically configured organic optoelectronic components 1. Here, each covering body 38, in particular the metal layer, is visible in a top view, wherein adjacent organic optoelectronic components 1 are separated from one another by means of a gap.

The covering body 38 of each organic optoelectronic component 1 includes a first recess 30, a second recess 31, and an additional recess 15. The additional recess 15 is used for the external electrical contacting of the corresponding second electrode 23. The first recess 30 is used for the external electrical contacting of the corresponding first electrode 20 during test operation of the organic optoelectronic component 1 in the wafer assembly. The second recess 31 is used for the external electrical contacting of the corresponding first electrode 20 during application operation of the organic optoelectronic component 1 in the singulated state.

The plurality of recesses 30, 31 in the covering body 38 enable test operation in the wafer assembly and application operation in the singulated state of the organic optoelectronic component 1, wherein in application operation, an intact terminal point, for example, an interface, may be provided. Measurement of the organic optoelectronic components 1 produced in the wafer assembly thus becomes possible in the wafer assembly, without significantly damaging the external contacting and/or limiting the user.

Figure 3A:
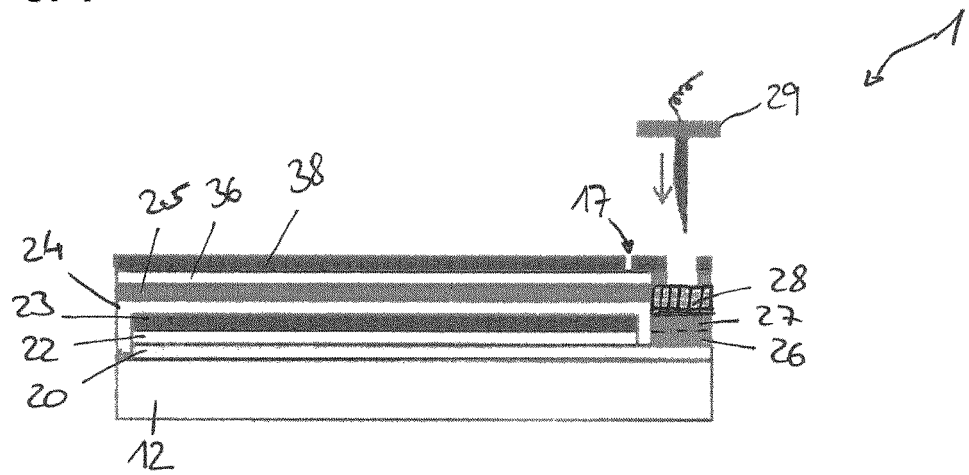
FIG. 3A shows a lateral cross-sectional view of an embodiment of an organic optoelectronic component.

FIG. 3A shows an embodiment of an organic optoelectronic component 1, in which the adhesive layer 36 demonstrates electrically conductive properties, in particular is an electrically conductively adjusted PSA layer. Electrical insulation at individual regions of the covering body 38, in particular the metal layer, is provided by means of plastic inclusions, so-called plastic inserts, or by means of separation of the covering body 38 in a provided external contacting region, for example, by means of a gap 17. As a result, direct contacting of the organic optoelectronic component 1 in the wafer assembly becomes possible for test operation via the covering body 38. The elastomer connector thereby remains completely intact for the customer.

Figure 3B:
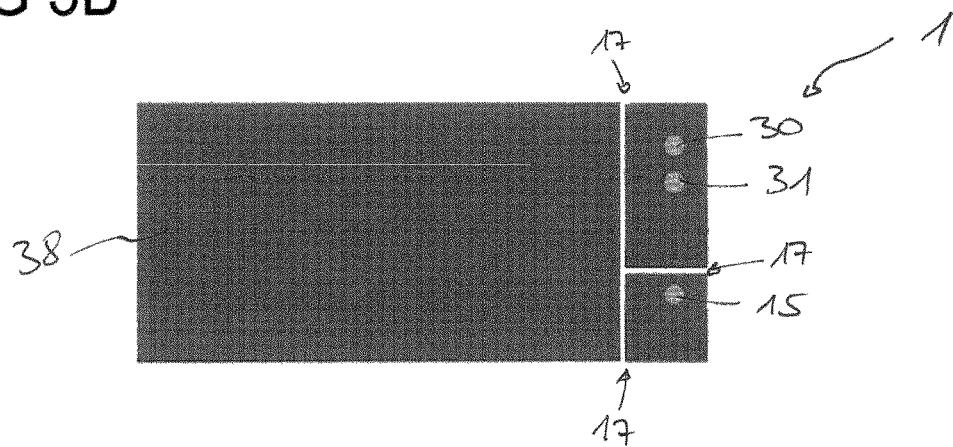
FIG. 3B shows a top view onto the embodiment of the organic optoelectronic component of FIG. 3A.

FIG. 3B shows a top view of the embodiment of the organic optoelectronic component 1 of FIG. 3A. The covering body 38 includes three regions which are electrically insulated from one another, each being separated from one another via gaps 17. In one region, the first recess 30 and the second recess 31 are arranged for electrically contacting the first electrode 20, in particular for test operation and for application operation. In an adjacent region, an additional recess 15 is arranged for contacting the second electrode 23. The last region is not provided for electrical contacting, and is used for covering the layers of the organic optoelectronic component 1.

Figure 4:
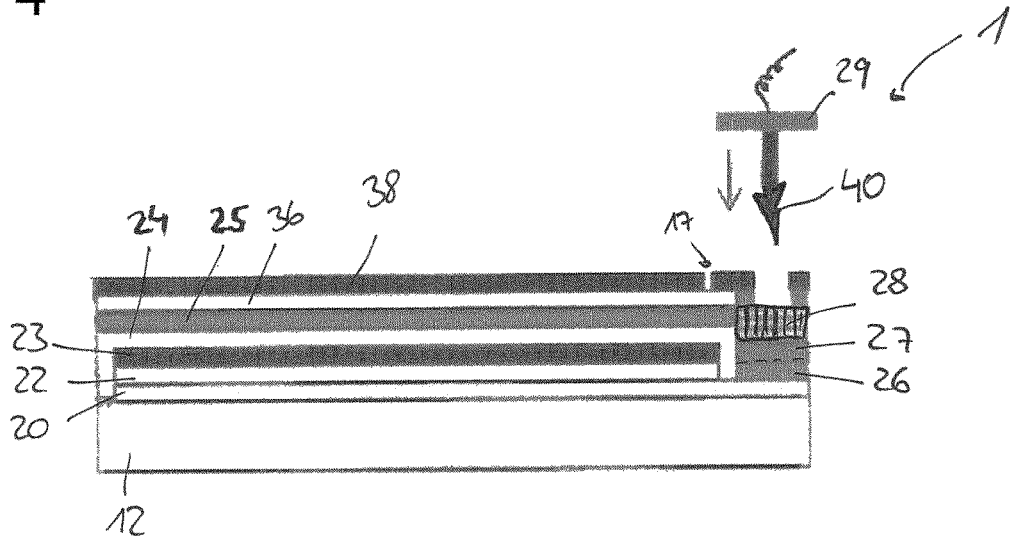
FIG. 4 shows a lateral cross-sectional view of an embodiment of an organic optoelectronic component.

FIG. 4 shows an embodiment of an organic optoelectronic component 1 in which the contact pin 29 includes a barb 40. The barb 40 enables a positively locking connection between the contact pin 29 and the elastomer connector 28. By means of the barb 40, which is inserted into the elastomer connector 28 and is encompassed by it for electrical contacting, the external connection to the customer-side application may be designed in a more robust and permanent manner. Easy removal of the contact pin from the elastomer connector 28 is thus made more difficult.

The present disclosure is not limited to the specified embodiments. For example, the organic optoelectronic component 1, in particular the organic functional layer structure 22, may be configured to be segmented. Alternatively or in addition, a plurality of organic optoelectronic components 1 may be arranged next to one another to form an organic optoelectronic assembly.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

LIST OF REFERENCE NUMBERS

Organic optoelectronic component 1
Carrier 12
Additional recess 15
Gap 17
First electrode 20
Organic functional layer structure 22
Second electrode 23
Encapsulation layer 24
Cladding layer 25
Metal contact 26
Conductive adhesive 27
Elastomer connector 28
Contact pin 29
First recess 30
Second recess 31
Adhesive layer 36
Covering body 38
Barb 40

The invention claimed is:

1. An organic optoelectronic component comprising:
    a first electrode;
    an organic functional layer structure above the first electrode;
    a second electrode above the organic functional layer structure;
    at least one contact section for electrically contacting the organic optoelectronic component, wherein the at least one contact section is electrically connected to one of the electrodes; and
    an electrically conductive elastomer connector which is arranged above the at least one contact section and is electrically connected to the at least one contact section,
    wherein the at least one contact section comprises a top surface that faces the elastomer connector,
    wherein the elastomer connector comprises a top surface and a bottom surface opposite the top surface, the bottom surface of the elastomer connector faces the at least one contact section,
    wherein the bottom surface of the elastomer connector is coupled to the top surface of the at least one contact section, and
    wherein the elastomer connector is configured to receive at least one external connection member into the elastomer connector through the top surface of the elastomer connector.

2. The organic optoelectronic component as claimed in claim 1,
    wherein the elastomer connector is elastic and has a modulus of elasticity from 1 N/mm$^2$ to 10 N/mm$^2$.

3. The organic optoelectronic component as claimed in claim 1,
    wherein the elastomer connector comprises electrically conductive material and electrically insulating material.

4. The organic optoelectronic component as claimed in claim 3,
    wherein the elastomer connector comprises alternating electrically conductive and electrically insulating layers, each layer oriented perpendicular to the top surface of the contact section so that one edge surface of each layer faces the top surface of the contact section,
    wherein the electrically conductive layers are electrically connected to the contact section through the one edge surface of each layer that faces the top surface of the contact section.

5. The organic optoelectronic component as claimed in claim 3,
    wherein the elastomer connector comprises an electrically insulating carrier material in which electrically conductive structures are embedded.

6. The organic optoelectronic component as claimed in claim 3,
    wherein the elastomer connector comprises an electrically insulating base body which is wrapped with an electrically conductive thread, wherein an axis of the base body about which the thread is wrapped extends in a lateral direction.

7. The organic optoelectronic component as claimed in claim 1,
    wherein the at least one external connection member is a contact pin,
    wherein the elastomer connector is configured to retain the contact pin in a force-locking manner.

8. The organic optoelectronic component as claimed in claim 7,
    wherein the contact pin comprises a barb, wherein the elastomer connector is configured to retain the contact pin comprising the barb in a positively locking manner.

9. The organic optoelectronic component as claimed in claim 1,
    wherein the elastomer connector is elastic and has a modulus of elasticity from 2.5 N/mm$^2$ to 7.5 N/mm$^2$.

10. The organic optoelectronic component as claimed in claim 1, further comprising:
    a cover layer above the elastomer connector, the cover layer comprising at least one hole configured as a recess of the organic optoelectronic component to pass through the at least one external connection member into the elastomer connector.

11. The organic optoelectronic component as claimed in claim 10,
    wherein the organic optoelectronic component is one of a plurality of organic optoelectronic components of a wafer assembly,
    wherein the at least one hole comprises:
        a first hole in the cover layer comprising a first recess configured to pass through one of the at least one external connection member into a portion of the elastomer connector exposed by the first hole for electrically connecting to the organic optoelectronic component in the wafer assembly; and
        a second hole in the cover layer comprising a second recess configured to pass through another of the at least one external connection member into a portion of the elastomer connector exposed by the second hole for electrically connecting to the organic optoelectronic component in a singulated state.

12. The organic optoelectronic component as claimed in claim 1, further comprising:
    a substrate having an optical area and at least one connection area adjacent to the optical area, wherein the first electrode, the organic functional layer structure, and the second electrode are formed in the optical area of the substrate, wherein the at least one contact section and the elastomer connector are formed in the at least one connection area of the substrate; and
    a cover layer above the optical area and the least one connection area, wherein the respective portions of the cover layer above the optical area and the at least one connection area are electrically insulated from each other, wherein the portion of the cover layer above the at least one connection area comprises two openings, both openings comprising recesses of the organic optoelectronic component configured to expose portions of the elastomer connector for receiving the at least one external connection member, wherein the at least one external connection member is removably insertable.

13. The organic optoelectronic component as claimed in claim 1, wherein the first electrode comprises a first portion and a second portion, wherein the organic functional layer structure is arranged above a first portion of the first electrode, and wherein the at least one contact section is arranged above a second portion of the first electrode and is electrically connected to the first electrode.

14. An organic optoelectronic component comprising:

a substrate having an optical area and at least one connection area adjacent to the optical area;

a first electrode above the substrate in the optical area;

an organic functional layer structure above the first electrode in the optical area;

a second electrode above the organic functional layer structure in the optical area; and at least one recessed electrical connector above the substrate in the at least one connection area, the at least one recessed electrical connector configured to provide disconnectable coupling to the organic optoelectronic component comprising:

a metal contact, the metal contact is electrically connected to one of the electrodes;

an elastic body directly above the metal contact, the elastic body is electrically conductive and is electrically connected to the metal contact, wherein the elastic body is configured to receive a removably insertable pin into the elastic body; and a cover layer directly above the elastic body, the cover layer comprising an opening that exposes a portion of the elastic body thereby forming a recess configured to pass the metal pin into the elastic body.

15. The organic optoelectronic component as claimed in claim 14, wherein the cover layer comprises a metal foil layer, wherein the cover layer is also above the second electrode, wherein the portion of the cover layer above the second electrode is electrically insulated from the portion of the cover layer above the elastic body.

16. An organic optoelectronic component comprising:

a substrate comprising an optical area and at least one connection area adjacent to the optical area;

an optical portion formed in the optical area of the substrate, wherein the optical portion comprises:

a first electrode on the substrate;

an organic functional layer structure on the first electrode; and a second electrode on the organic functional layer structure; and at least one connection portion formed in the at least one connection area of the substrate, wherein the at least one connection portion comprises:

a metal contact on the substrate, the metal contact is coupled to one of the electrodes; and an elastic body on the metal contact, the elastic body is electrically conductive and is coupled to the metal contact, wherein the elastic body is configured to receive at least one external connection member into the elastic body.

* * * * *